(12) United States Patent
Kulkarni et al.

(10) Patent No.: US 11,687,133 B2
(45) Date of Patent: Jun. 27, 2023

(54) LAPTOP COMPUTER WITH DISPLAY-SIDE COOLING SYSTEM

(71) Applicant: NVIDIA CORPORATION, Santa Clara, CA (US)

(72) Inventors: Amit Kulkarni, San Jose, CA (US); Gabriele Gorla, Santa Clara, CA (US); Andrew Bell, San Francisco, CA (US); Boris Landwehr, Thousand Oaks, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/111,437

(22) Filed: Dec. 3, 2020

(65) Prior Publication Data
US 2021/0173456 A1    Jun. 10, 2021

Related U.S. Application Data

(60) Provisional application No. 62/945,056, filed on Dec. 6, 2019.

(51) Int. Cl.
*H05K 7/20* (2006.01)
*F28F 3/02* (2006.01)
(Continued)

(52) U.S. Cl.
CPC ............ *G06F 1/203* (2013.01); *G06F 1/1637* (2013.01); *G06F 1/1681* (2013.01);
(Continued)

(58) Field of Classification Search
CPC ...... G06F 1/203; G06F 1/1637; G06F 1/1681; H05K 7/20145; H05K 7/20163;
(Continued)

(56) References Cited

U.S. PATENT DOCUMENTS 4,980,848 A * 12/1990 Griffin .................... G06F 1/203
361/679.09
5,002,123 A * 3/1991 Nelson ..................... F28F 3/02
165/147
(Continued)

FOREIGN PATENT DOCUMENTS

| CN | 201123208 Y | * | 9/2008 |
| CN | 201127158 Y | * | 10/2008 |
| CN | 213750815 U | * | 7/2021 |

OTHER PUBLICATIONS

Non-Final Office Action received for U.S. Appl. No. 17/111,440, dated Oct. 1, 2021, 19 pages.
(Continued)

*Primary Examiner* — Michael A Matey
(74) *Attorney, Agent, or Firm* — Artegis Law Group, LLP

(57) ABSTRACT

A computing device comprises: a heat sink that has a plurality of cooling fins and a vapor chamber; one or more heat-generating electronic devices that are thermally coupled to the vapor chamber; and at least one cooling fan configured to direct cooling air across the plurality of cooling fins, wherein a first fin included in the plurality of cooling fins and a second fin included in the plurality of cooling fins form a first air passage that has a first air inlet opening and a first air outlet opening, and wherein the first fin is adjacent to the second fin, and a first distance between the first fin and the second fin proximate to the first air inlet opening is less than a second distance between the first fin and the second fin proximate to the first air outlet opening.

20 Claims, 9 Drawing Sheets

(51) Int. Cl.
  *G06F 1/20* (2006.01)
  *G06F 1/16* (2006.01)
(52) U.S. Cl.
  CPC ..... *H05K 7/20145* (2013.01); *H05K 7/20163* (2013.01); *H05K 7/20172* (2013.01); *H05K 7/20409* (2013.01); *H05K 7/20963* (2013.01); *H05K 7/20972* (2013.01); *H05K 7/20318* (2013.01)
(58) Field of Classification Search
  CPC ........... H05K 7/20172; H05K 7/20409; H05K 7/20963; H05K 7/20972; H05K 7/20318
  See application file for complete search history.

(56) References Cited

U.S. PATENT DOCUMENTS

| | | | |
|---|---|---|---|
| 5,383,340 A * | 1/1995 | Larson | F28D 15/0266 257/E23.088 |
| 5,606,341 A | 2/1997 | Aguilera | |
| 5,634,351 A * | 6/1997 | Larson | F28D 15/0266 165/104.33 |
| 5,774,333 A * | 6/1998 | Janik | G06F 1/20 361/679.26 |
| 6,181,555 B1 | 1/2001 | Haley et al. | |
| 6,212,069 B1 * | 4/2001 | Janik | G06F 1/1616 165/86 |
| 6,674,642 B1 * | 1/2004 | Chu | G06F 1/203 165/80.4 |
| 6,714,403 B2 | 3/2004 | Furuki et al. | |
| 6,778,392 B2 * | 8/2004 | Chiou | G06F 1/203 165/121 |
| 6,816,371 B2 * | 11/2004 | Agata | G06F 1/203 165/121 |
| 6,913,069 B2 * | 7/2005 | Barsun | F28F 3/02 165/185 |
| 7,502,227 B2 * | 3/2009 | Uchida | G06F 1/203 361/679.5 |
| 7,581,585 B2 | 9/2009 | Tuma | |
| 7,593,230 B2 * | 9/2009 | Abul-Haj | F28F 3/02 361/702 |
| 7,633,751 B2 | 12/2009 | Shinotou et al. | |
| 8,496,213 B1 | 7/2013 | Kunert et al. | |
| 8,699,226 B2 * | 4/2014 | Tanner | F28F 19/00 361/710 |
| 9,807,906 B2 * | 10/2017 | Zhang | H05K 7/20272 |
| 9,823,631 B1 | 11/2017 | Loo et al. | |
| 9,836,101 B1 | 12/2017 | Saravis | |
| 10,338,650 B1 * | 7/2019 | Keilers | H05K 7/20336 |
| 10,852,775 B1 | 12/2020 | Kim et al. | |
| 10,877,529 B2 | 12/2020 | Saravis | |
| 10,915,153 B2 | 2/2021 | Todrzak | |
| 11,073,878 B2 | 7/2021 | Liu et al. | |
| 2004/0070942 A1 | 4/2004 | Tomioka et al. | |
| 2004/0114324 A1 | 6/2004 | Kusaka et al. | |
| 2006/0082518 A1 | 4/2006 | Ram | |
| 2007/0152633 A1 | 7/2007 | Lee | |
| 2007/0227707 A1 * | 10/2007 | Machiroutu | H01L 23/427 165/121 |
| 2009/0195983 A1 * | 8/2009 | Reichert | G06F 1/203 361/697 |
| 2010/0296009 A1 | 11/2010 | Shinki et al. | |
| 2011/0023272 A1 | 2/2011 | Huang | |
| 2013/0083253 A1 * | 4/2013 | Maeshima | H04N 5/64 348/739 |
| 2013/0194744 A1 * | 8/2013 | Chen | H01L 23/467 361/679.47 |
| 2014/0160657 A1 * | 6/2014 | Morrison | G06F 1/166 361/679.21 |
| 2014/0185231 A1 | 7/2014 | Kamimura et al. | |
| 2014/0376145 A1 * | 12/2014 | Zhang | G06F 1/1681 361/143 |
| 2015/0017905 A1 | 1/2015 | Li et al. | |
| 2015/0153113 A1 * | 6/2015 | Glover | F28F 3/048 361/692 |
| 2015/0346784 A1 * | 12/2015 | Delano | G06F 1/203 361/679.47 |
| 2017/0023308 A1 | 1/2017 | Huang et al. | |
| 2017/0153677 A1 | 6/2017 | Cheng et al. | |
| 2017/0246712 A1 | 8/2017 | Yang et al. | |
| 2018/0024599 A1 * | 1/2018 | Sakata | H01L 23/473 361/679.47 |
| 2018/0040532 A1 | 2/2018 | Wu et al. | |
| 2018/0164042 A1 * | 6/2018 | Stellman | C25D 5/10 |
| 2018/0284858 A1 | 10/2018 | Lee | |
| 2018/0317343 A1 | 11/2018 | Lin | |
| 2018/0329464 A1 * | 11/2018 | Lin | G06F 1/1681 |
| 2018/0352676 A1 | 12/2018 | Degner et al. | |
| 2019/0141855 A1 | 5/2019 | Inagaki et al. | |
| 2019/0250681 A1 | 8/2019 | Kirch | |
| 2019/0302872 A1 | 10/2019 | MacDonald | |
| 2019/0317572 A1 * | 10/2019 | North | G06F 1/1616 |
| 2020/0381337 A1 | 12/2020 | Ghioni et al. | |
| 2021/0018965 A1 | 1/2021 | Watanabe et al. | |
| 2021/0103314 A1 | 4/2021 | Ko et al. | |

OTHER PUBLICATIONS

Final Office Action received for U.S. Appl. No. 17/111,440 dated Jan. 13, 2022, 16 pages.
Non Final Office Action received for U.S. Appl. No. 17/111,435 dated Mar. 1, 2022, 42 pages.
Notice of Allowance received for U.S. Appl. No. 17/111,440 dated May 27, 2022, 13 pages.
Final Office Action received for U.S. Appl. No. 17/111,435 dated Jun. 10, 2022, 32 pages.
Non Final Office Action received for U.S. Appl. No. 17/111,435 dated Oct. 26, 2022, 26 pages.
Final Office Action received for U.S. Appl. No. 17/111,435 dated Apr. 21, 2023, 20 pages.

* cited by examiner

LAPTOP COMPUTER WITH DISPLAY-SIDE COOLING SYSTEM

CROSS-REFERENCE TO RELATED APPLICATIONS

This application claims priority benefit of the U.S. Provisional Application titled "LAPTOP COMPUTER DISPLAY WITH DISPLAY-SIDE COOLING SYSTEM," filed Dec. 6, 2019 and having Ser. No. 62/945,056. The subject matter of this related application is hereby incorporated by reference.

BACKGROUND

Field of the Various Embodiments

Embodiments of the present disclosure relate generally to computer architecture and thermal solutions for computing devices and, more specifically, to a laptop computer with a display-side cooling system.

Description of the Related Art

In most, if not all, laptop computers, the motherboard is positioned directly beneath the keyboard. As a result, the heat generated by electronic components mounted on the motherboard, such as the central processing unit (CPU) and graphics processing unit (GPU), oftentimes causes the palm rest areas of the laptop to heat up during use. Sometimes, and particularly in high-power laptops, the palm rest areas can be warm enough to be uncomfortable for the user. This problem has been mitigated by integrating various combinations of heat sinks, heat pipes, and air mover solutions into laptop computers that transport the heat generated at the motherboard away from the palm rest of the laptop. These approaches, though, have certain drawbacks.

First, due to space restrictions, the heat sinks and fans typically employed in laptop computers are generally relatively small. As a result, the fans have to operate at very high speeds in order to remove enough heat from laptop computers (via the heatsinks) when the laptop computers operate at peak performance. The high speeds of the fans can cause a level of audible noise and vibration that can degrade the overall quality of the user experience. This problem is especially true in high-performance laptop computers, which can produce significant amounts of heat when processing larger and more complex workloads. Second, the surface temperature of the base of a laptop computer can become elevated even when the palm rest area of the laptop computer is being cooled. The resulting non-uniform surface temperatures of the laptop computer can cause an overall poor ergonomic experience for the user. Further, the surface temperature of the base of laptop computer can easily exceed temperatures that are considered to be comfortable to users over extended periods of time. Third, the ability of a conventional laptop computer thermal solution to transfer heat away from the motherboard can vary substantially depending on whether the laptop computer is resting on a hard surface or on the lap of a user. For example, when a laptop computer is resting in a user's lap, the fan inlets can become partially or even completely blocked, greatly reducing airflow across the heat sink and restricting heat transfer from the motherboard. Requiring users to use laptop computers on hard surfaces to achieve better thermal performance can degrade the overall quality of the user experience.

As the foregoing illustrates, what is needed in the art are more effective approaches to cooling laptop computers during operation.

SUMMARY

One embodiment of the present disclosure sets forth a technique for cooling heat-generating components of a computing device. In the various embodiments, a portable computing device, comprises: a base portion that includes a keyboard; and a display portion that is movably coupled to the base portion and includes: a heat sink with cooling fins; one or more heat-generating electronic devices that are thermally coupled to the heat sink; and at least one cooling fan configured to direct cooling air across the cooling fins.

One embodiment of the present disclosure sets forth another technique for cooling heat-generating components of a computing device. In the various embodiments, an apparatus includes: a heat sink that has a plurality of cooling fins and a vapor chamber; one or more heat-generating electronic devices that are thermally coupled to the vapor chamber; and at least one cooling fan configured to direct cooling air across the plurality of cooling fins, wherein a first fin included in the plurality of cooling fins and a second fin included in the plurality of cooling fins form a first air passage that has a first air inlet opening and a first air outlet opening, and wherein the first fin is adjacent to the second fin, and a first distance between the first fin and the second fin proximate to the first air inlet opening is less than a second distance between the first fin and the second fin proximate to the first air outlet opening.

One embodiment of the present disclosure sets forth a technique for cooling heat-generating components of a computing device. In the various embodiments, a computing device, comprises: a base portion; a display portion that is movably coupled to the base portion and includes a housing having a movable panel and one or more fixed panels; and a mechanical assembly that positions the movable panel away from the one or more fixed panels as the display portion opens away from the base portion.

At least one technical advantage of the disclosed design relative to the prior art is that, in the disclosed design, the heat-generating integrated circuits are disposed within the display portion of the computing device, which allows a larger vapor chamber to be implemented. The larger vapor chamber enables greater heat removal capacity and greater cooling efficiency, which allows the computing device to perform at higher operating levels. Further, in the disclosed design, the cooling fans also are disposed within the display portion of the computing device, which allows larger cooling fans to be implemented. Because larger cooling fans can provide sufficient levels of cooling airflow at lower speeds, cooling fan noise is reduced in the disclosed design without negatively impacting the peak computational performance of the computing device. In addition, in the disclosed design, air outlet openings also are disposed within the display portion of the computing device, which results in cooling airflow being directed away from the user and a further reduction in overall cooling fan noise.

Another technical advantage of the disclosed design relative to the prior art is that, in the disclosed design, the cooling fins of the heat exchanger are more aligned with the direction of incoming airflow relative to the cooling fins of a conventional heat exchanger. As a result, there is relatively less pressure drop across the heat exchanger in the disclosed design. Among other things, the reduced pressure drop enables sufficient levels of cooling airflow to be provided at lower cooling fan speeds, thereby reducing cooling fan noise without negatively impacting the peak computational performance of the computing device.

Yet another technical advantage of the disclosed design relative to the prior art is that, in the disclosed design, the inlet openings for the cooling fans are formed in surfaces of the computing device other than the bottom surface of the computing device. Thus, with the disclosed design, the cooling efficiency of the computing device is not affected by the surface on which the computing device rests. In addition, in the disclosed design, the inlet openings for the cooling fans that are formed via the movable panel have a greater free area, and a correspondingly lower pressure drop, relative to the air inlet openings disposed on the bottom surface of a conventional laptop computer. Among other things, the lower pressure drop enables sufficient levels of cooling airflow to be provided at lower cooling fan speeds, thereby reducing cooling fan noise without negatively impacting the peak computational performance of the computing device.

These technical advantages represent one or more technological improvements over prior art computing device designs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the embodiments of the present disclosure. However, it will be apparent to one of skill in the art that the embodiments of the present disclosure may be practiced without one or more of these specific details.

Introduction

Various embodiments of the present disclosure set forth a laptop computer with a display-side cooling system. In some embodiments, the display portion of a laptop houses a motherboard having one or more processors mounted thereon, such as a central processing unit (CPU) and/or a graphics processing unit (GPU), a single heat sink on which the motherboard is mounted, and at least one cooling fan configured to direct cooling air across cooling fins of the heat sink. Thus, in such embodiments, the largest heat sources in the laptop computer and the cooling system for removing heat generated by such heat sources are disposed in the display portion of the laptop computer, rather than in a base portion of the laptop computer that houses the keyboard.

Additionally, in some embodiments, a vapor chamber included in the heat sink is configured as a support structure for the motherboard and/or one or more cooling fans located in the display portion. In such embodiments, the vapor chamber may be formed from titanium and may include a novel internal support column configuration that reduces weight and/or deflection of the vapor chamber compared to a conventional heat sink vapor chamber. Additionally, in some embodiments, the display portion of the laptop computer includes one or more cooling fan inlets and/or one or more cooling fan outlets that are each located in or on a surface of the display portion. In such embodiments, the one or more cooling fan inlets may be fixed in size or may be configured to open when the display portion of the laptop computer is opened from the base portion. Additionally, in some embodiments, cooling fins thermally coupled to the vapor chamber are configured as an array of radially diverging fins. In such embodiments, the radially diverging fins can be aligned with the direction of incoming airflow, which reduces pressure drop associated with airflow across the cooling fins. Additionally, in some embodiments, the display portion of the laptop computer includes a display screen that is configured to move away from the heat-generating components in the display portion, such as the motherboard, when the display portion is opened from the base portion. Thus, in such embodiments, an air gap between the display screen and heat-generating components in the display portion are separated by an air gap, which prevents overheating of portions of the display screen during operation of the laptop computer.

System Overview

Figure 1:
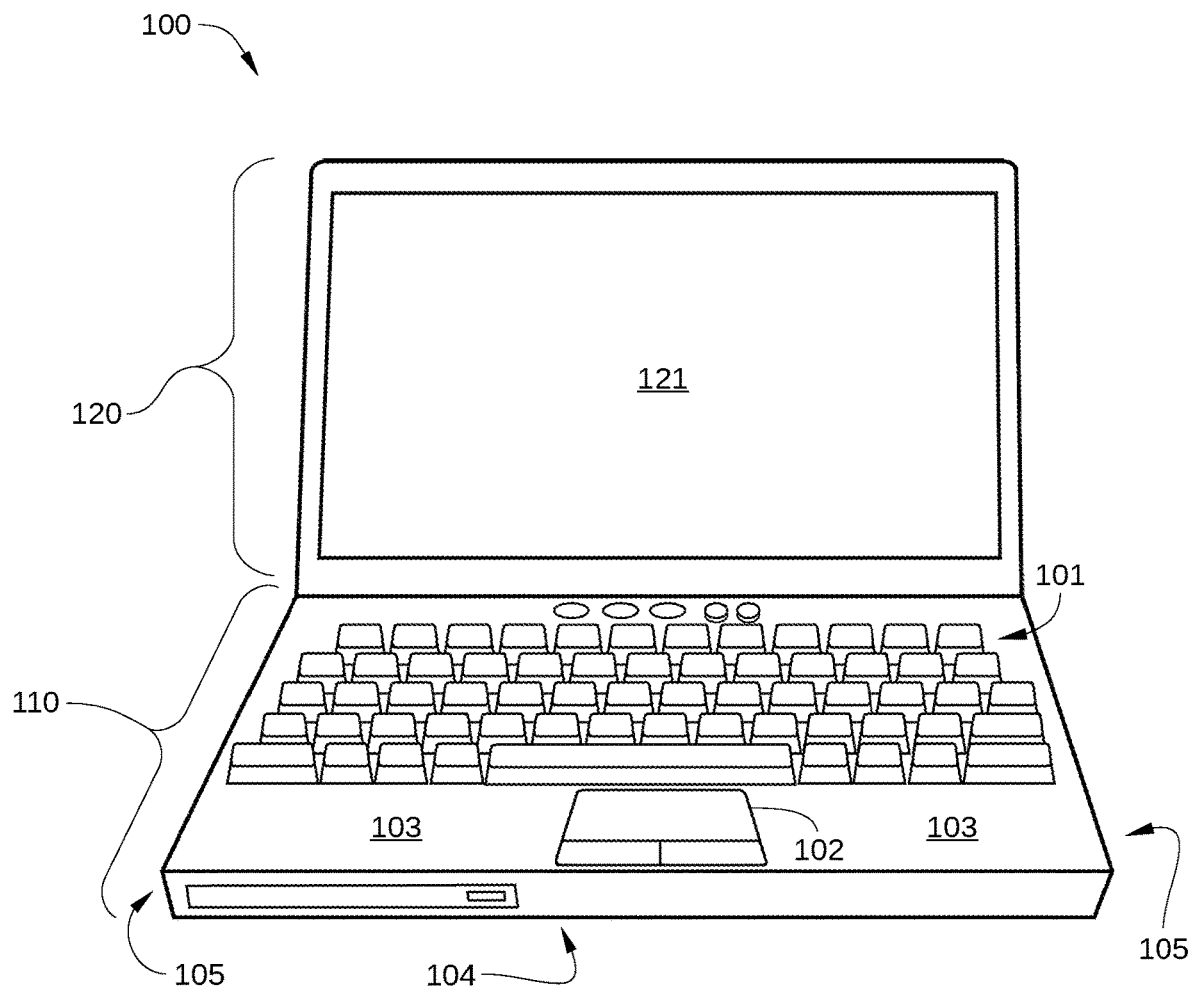
FIG. 1 illustrates a laptop computer configured to implement one or more aspects of the various embodiments.

FIG. 1 illustrates a laptop computer 100 configured to implement one or more aspects of the various embodiments. Laptop computer 100 is a portable personal computer with a hinged, or "clamshell," configuration, and generally includes the capabilities of a desktop computer and associated external devices. For example, in some embodiments, laptop computer 100 includes an integrated keyboard 101, a touchpad (or trackpad) 102, and a display screen 121. By folding display screen 121 closed onto keyboard 101, laptop computer 100 can be readily stowed and carried. Therefore, laptop computer 100 can be easily transported and is suitable for mobile use. As shown, laptop computer 100 includes a base portion 110 and a display portion 120 that is movably coupled to base portion 110. Base portion 110 includes keyboard 101, touchpad 102, and palm rests 103, and display portion 120 includes display screen 121, such as a liquid crystal display (LCD) or light-emitting diode (LED) based display screen. Laptop computer 100 may further include physical interfaces for various input and output devices alongside edges 105 of base portion 110, such as one or more universal serial bus (USB) ports, external display ports, Ethernet ports, and the like. Laptop computer 100 may further include one or more integrated webcams and/or built-in microphones (not shown).

According to various embodiments, laptop computer 100 further includes a display-side cooling system and architecture that prevents palm rests 103 and a bottom surface 104 of base 110 from reaching elevated temperatures during use. In the embodiments, one or more major heat sources in laptop computer 100, such as motherboard-mounted processors, are located in display portion 100 rather than in base 110. Furthermore, in the embodiments, one or more heat transfer devices are also located in display portion 100 rather than in base 110, such as cooling fan(s) and a heat sink that is fluidly coupled to the cooling fans and thermally coupled to the heat sources. One such embodiment is illustrated in FIGS. 2A, 2B, and 2C.

Figures 2A, 2B:
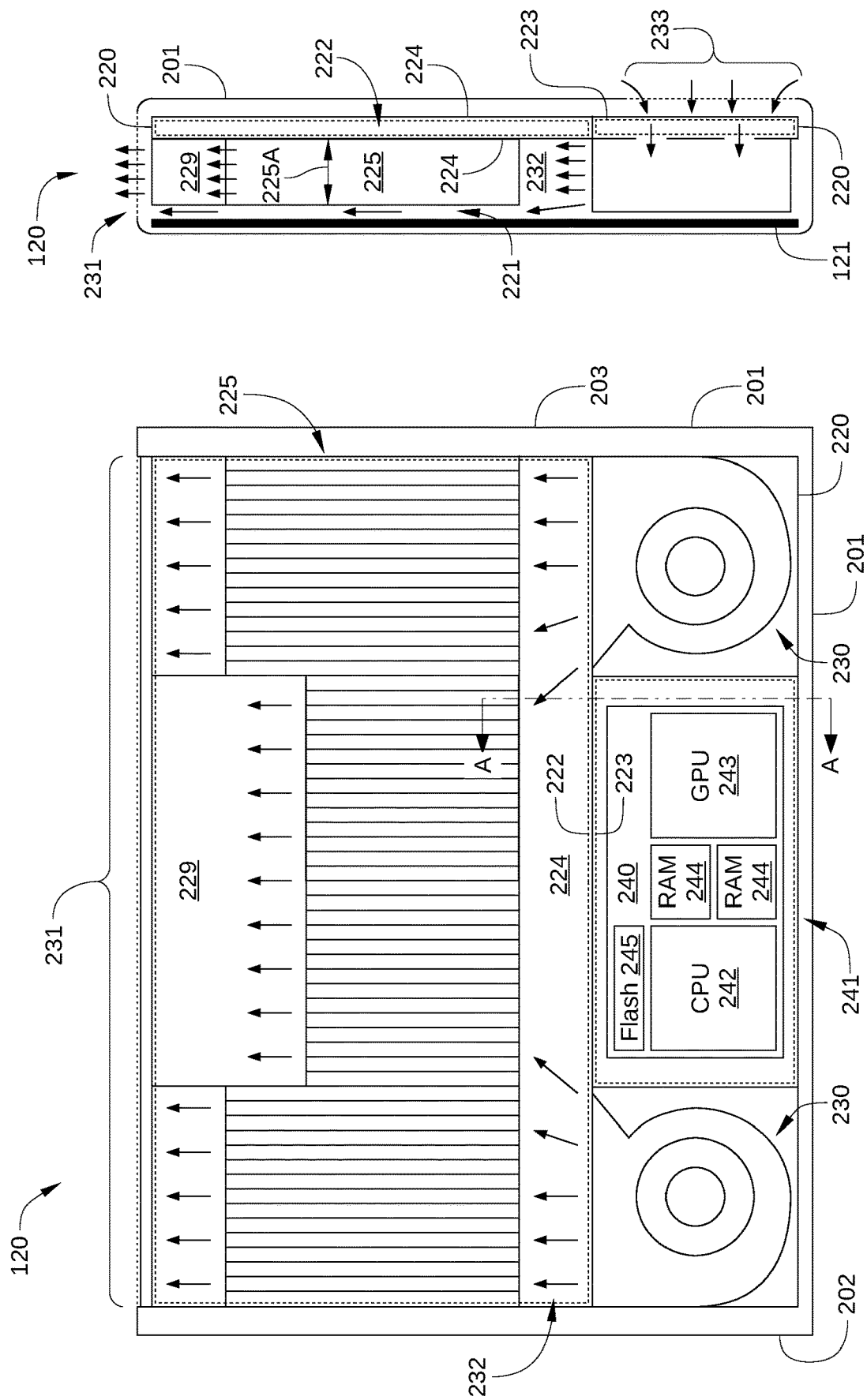
FIG. 2A is a schematic front view of the display portion of the laptop computer of FIG. 1, according to various embodiments.
FIG. 2B is a schematic side view of the display portion of the laptop computer of FIG. 1, according to various embodiments.
Figure 2C:
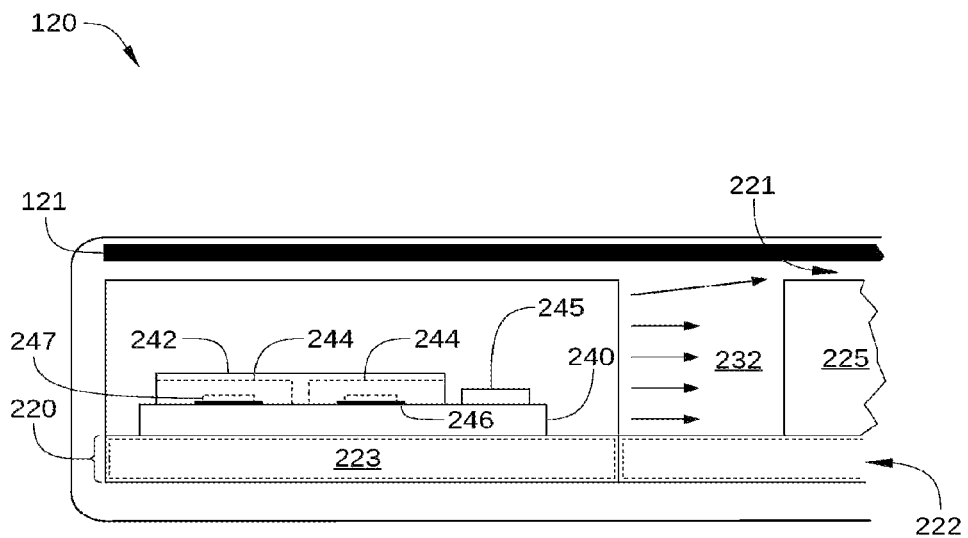
FIG. 2C is a partial cross-sectional view of the display portion of the laptop computer of FIG. 1, taken along section line A-A shown in FIG. 2A, according to various embodiments.

FIG. 2A is a schematic front view of display portion 120, according to various embodiments. FIG. 2B is a schematic side view of display portion 120, according to various embodiments. FIG. 2C is a partial cross-sectional view of display portion 120, taken along section line A-A shown in FIG. 2A, according to various embodiments.

Display portion 120 includes a heat sink 220 configured as a support structure within a housing 201 or other exterior case of display portion 120. In addition, display portion 120 includes cooling fans 230 mounted on heat sink 220, and a printed circuit board (PCB) 240 mounted on heat sink 220. For example, in some embodiments, PCB 240 is a motherboard for laptop computer 100. As such, various heat-generating electronic devices 241 (indicated in FIG. 2A) are mounted on PCB 240, such as a central processing unit (CPU) 242, a graphics processing unit (GPU) 243, one or more memory chips 244, one or more flash memory devices 245, other heat-generating integrated circuits (not shown), and the like.

Heat-generating electronic devices 241 are thermally coupled to heat sink 220, for example via PCB 240. In some embodiments, one or more of heat-generating electronic device 241 are thermally coupled to heat sink 220 or to PCB 240 via a highly heat-conducting material, such as a diamond-like carbon coating 246 (shown in FIG. 2C) formed via a chemical vapor deposition or physical vapor deposition process. In some embodiments, diamond-like carbon coating 246 is formed at discrete locations proximate higher heat-generating regions of a heat-generating electronic device 241, such as a processing core 247 (shown in FIG. 2C) of CPU 242 or GPU 243. Thus, in such embodiments, diamond-like carbon coating 246 is formed at specific portions of the interface between a heat-generating electronic device 241 and PCB 240 or heat sink 220.

In operation, heat generated by heat-generating electronic devices 241 is transferred away from PCB 240 and out of display portion 120 via heat sink 220 and cooling air that is forced across surfaces of heat sink 220 by fans 230. In some embodiments, one or more surfaces of housing 201 include a high-emissivity coating or surface, to further increase heat transfer from display portion 120 via radiative heat transfer. In the embodiment illustrated in FIGS. 2A-2C, PCB 240 is positioned between heat-generating electronic devices 241 and heat sink 220. In other embodiments, PCB 240 is positioned on one side of heat-generating electronic devices 241 and heat sink 220 is positioned on an opposite side of heat-generating electronic devices 241.

Display-Side Heat Sink

Heat sink 220 is a substantially planar structure that is positioned parallel to display screen 121 and, in some embodiments, is separated from display screen 121 by an airflow gap 221. In some embodiments, heat sink 220 is configured as a vapor chamber that includes a vapor region 222 and a condensate collection region 223. The working fluid disposed within heat sink 220 can include any technically feasible liquid that evaporates at temperatures reached by condensate collection region 223 during operation of laptop computer 100. For example, suitable working fluids include water, methyl alcohol, propylene glycol, various combinations thereof, and the like. In some embodiments, interior surfaces of vapor region 222 and condensate collection region 223 have undergone a passivation process to prevent corrosion of heat sink 220 and enhance wetting of the interior surfaces of vapor region 222. In such embodiments, heat sink 220 may further includes a wicking structure (not shown) formed from titanium or the titanium-containing alloy that is disposed within vapor region 222 and/or condensate collection region 223. In some embodiments, the wicking structure also undergoes the passivation process.

In some embodiments, heat sink 220 is formed from titanium or a titanium-containing alloy. In such embodiments, heat sink 220 generally has sufficient mechanical strength and rigidity to be employed as a structural element of display portion 120. Therefore, in such embodiments, heat sink 220 can have cooling fans 230, PCB 240, and/or other components mounted thereon, rather than on portions of housing 201. As a result, in such embodiments, heat sink 220 can be employed to cool multiple heat-generating devices, such as a CPU and a GPU. By contrast, heat sinks in conventional computing devices are typically dedicated to a single high-power device, such as a single processor.

As shown in FIGS. 2B and 2C, vapor region 222 and condensate collection region 223 are both disposed within heat sink 220 and are in fluid communication with each other. In such embodiments, condensate collection region 223 is configured to collect condensed liquid that is cooled in vapor region 222 of heat sink 220, and is located proximate to or in contact with PCB 240. Thus, heat generated by heat-generating electronic devices 241 is conducted by PCB 240 into condensate collection region 223, the condensed liquid in condensate collection region 223 is heated and evaporates into a vapor, and the vapor flows into vapor region 222. The condensation of the vapor onto interior surfaces of heat sink 220 in vapor region 222 then transfers the thermal energy originating from PCB 240 to walls 224 of vapor region 222. Walls 224 of vapor region 222 conduct thermal energy into an assembly of heat exchanger fins 225 that are coupled to an exterior surface of vapor region 222, and cooling air passing through the heat exchanger fins 225 from a plenum 232 and out cooling air outlet(s) 231 removes thermal energy from display portion 120. In some embodiments, heat sink 220 further includes ducts 229 for conducting cooling air from heat exchanger fins 225 to cooling air outlet(s) 231. Alternatively, some or all of heat exchanger fins 225 can extend to cooling air outlet(s) 231. One such embodiment is illustrated in FIG. 3.

Figure 3:
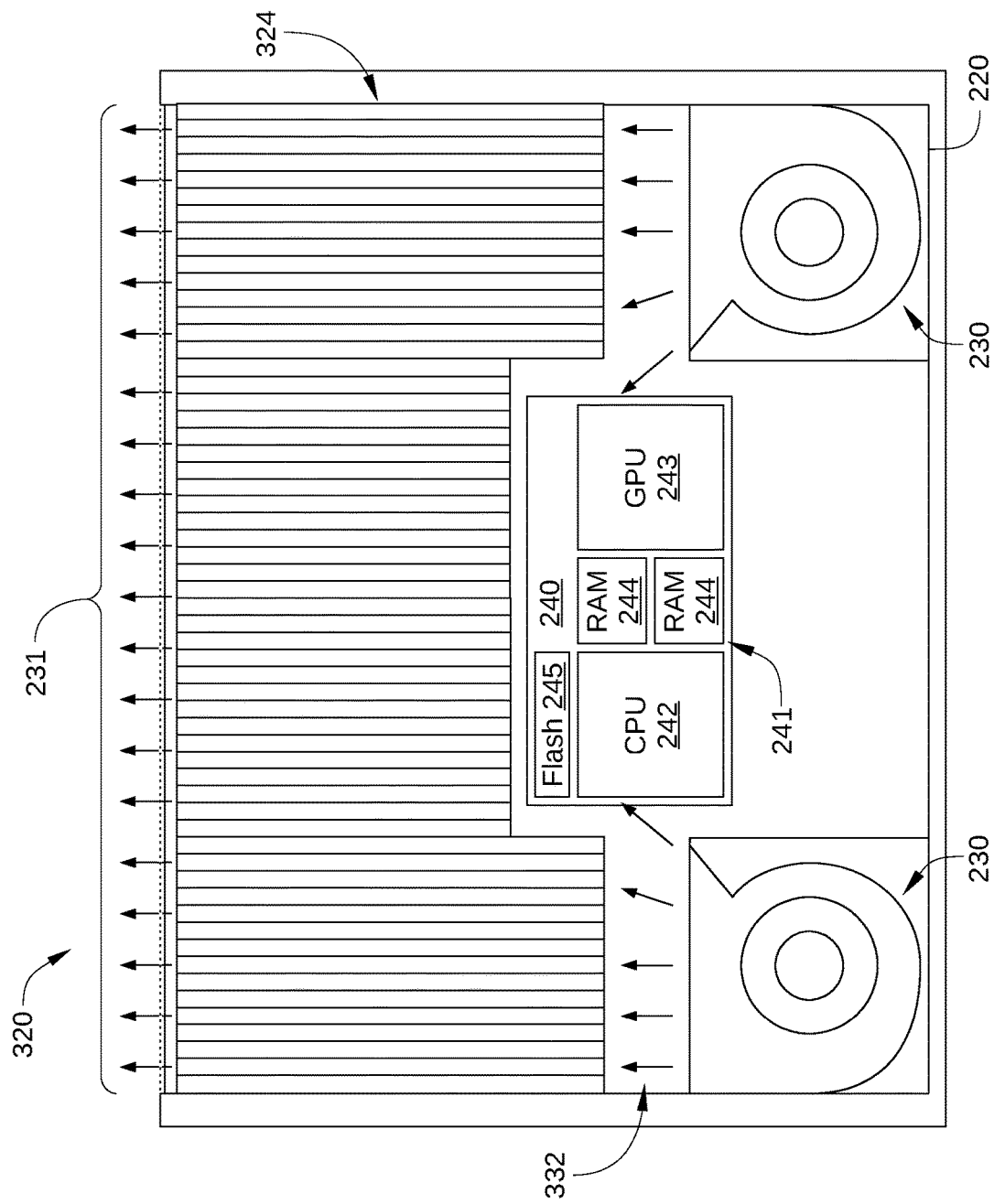
FIG. 3 is a schematic front view of the display portion of the laptop computer of FIG. 1, according to various embodiments.

FIG. 3 is a schematic front view of a display portion 320, according to various embodiments. In the embodiment illustrated in FIG. 3, heat exchanger fins 324 extend to cooling air outlet(s) 231. Additionally, in some embodiments, display portion 320 includes a plenum 332 having a different configuration than plenum 232 in FIG. 2A. In the embodiment illustrated in FIG. 3, one or more of heat-generating electronic devices 241 may be positioned on PCB 240 in such a way as to be disposed partially or completely within plenum 332. Thus, in such an embodiment, cooling air received by plenum 332 and flowing toward heat exchanger fins 324 can flow directly over such heat-generating electronic devices 241.

Returning to FIGS. 2A-2C, walls 224 of vapor region 222 can extend across the width of display portion 120. Thus, walls 224 have a large surface area, and enable the integration of a large surface-area assembly (or assemblies) of heat exchanger fins 225 in display portion 120. Unlike assemblies of heat exchanger fins associated with conventional heat sinks, which are disposed within a base portion of a laptop computer, heat exchanger fins 225 are distributed over a wide surface area, for example from a left edge 202 to a right edge 203 of housing 201. Because heat exchanger fins 225 are distributed across a large surface area, heat exchanger fins 225 generate less impedance to airflow (and therefore generate less pressure drop), and can accommodate a relatively larger quantity of cooling airflow than heat exchanger fins associated with a conventional heat sink disposed within a base portion of a laptop. As a result, airflow through or across heat exchange fins 225 can remove the same quantity of thermal energy from heat sink 220 at a significantly lower velocity than airflow through or across heat exchanger fins associated with a conventional heat sink that is disposed within a base portion of a laptop. Consequently, thermal energy is removed from heat sink 220 with significantly less fan noise (due to slower spinning fans) and less exhaust noise (due to lower velocity cooling air exiting laptop computer 100) than when conventional fans and heat sinks are employed in a laptop computer.

Due to the size of heat sink 220, changes in pressure within heat sink 220 can cause unwanted deflection of one or more surface of heat sink 220. In some embodiments, vapor region 222 and/or condensate collection region 223 are internally reinforced with support columns. One such embodiment is described below in conjunction with FIG. 4.

Figure 4:
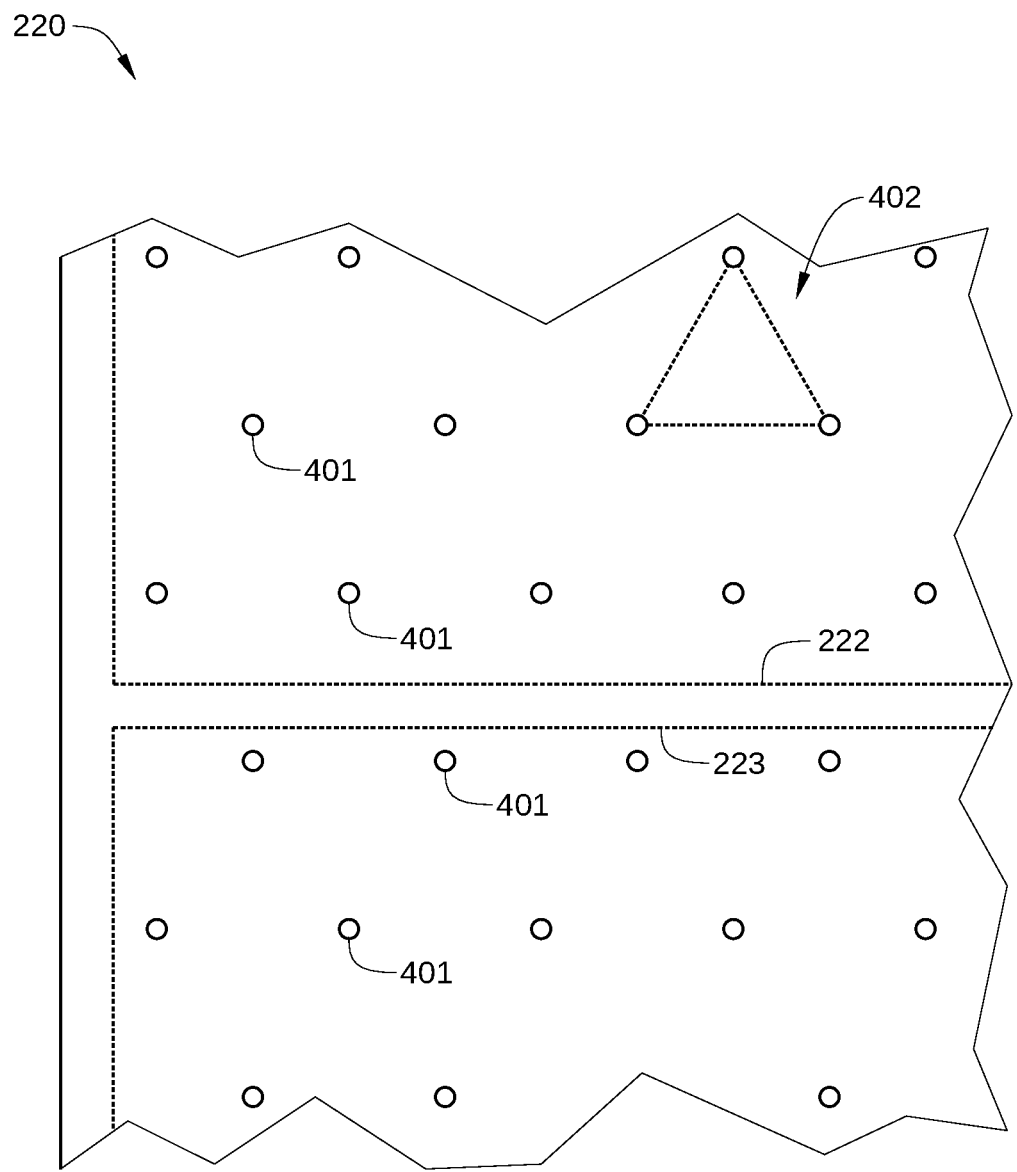
FIG. 4 is a schematic illustration of a portion of the heat sink of FIGS. 2A-2C, according to various embodiments.

FIG. 4 is a schematic illustration of a portion of heat sink 220, according to various embodiments. As shown, heat sink 220 includes vapor region 222 and a condensate collection region 223 (indicated by dashed lines). Further, heat sink 220 includes a plurality of internal support columns 401 that are disposed within vapor region 222 and/or condensate collection region 223. Internal support columns 401 are configured to reduce deflection of one or more surfaces of heat sink 220 due to changes in pressure within heat sink 220 during operation. In some embodiments, internal support columns 401 are formed from titanium. In some embodiments, internal support columns 401 are arranged in a repeating triangular pattern 402. In contrast with a configuration of internal support columns 401 that are arranged in a repeating rectangular pattern, the repeating triangular pattern illustrated in FIG. 4 provides the same rigidity and/or deflection of heat sink 220 with up to about 11% fewer internal support columns 401. Further, with fewer total internal support columns 401 disposed within heat sink 220, there is less impedance to the flow of condensed liquid during operation.

Returning to FIGS. 2A-2C, heat exchanger fins 225 are separated from display screen 121 by airflow gap 221, through which cooling air is forced during operation of laptop computer 100. In such embodiments, the cooling air forced through airflow gap 221 cools display screen 121 and thermally isolates display screen 121 from PCB 240 and heat-generating electronic devices 241 mounted on PCB 240. In other embodiments, some or all of heat exchanger fins 225 are in contact with and/or thermally coupled to display screen 121, and display screen 121 is cooled via conductive heat transfer to heat exchanger fins 225.

Figure 5:
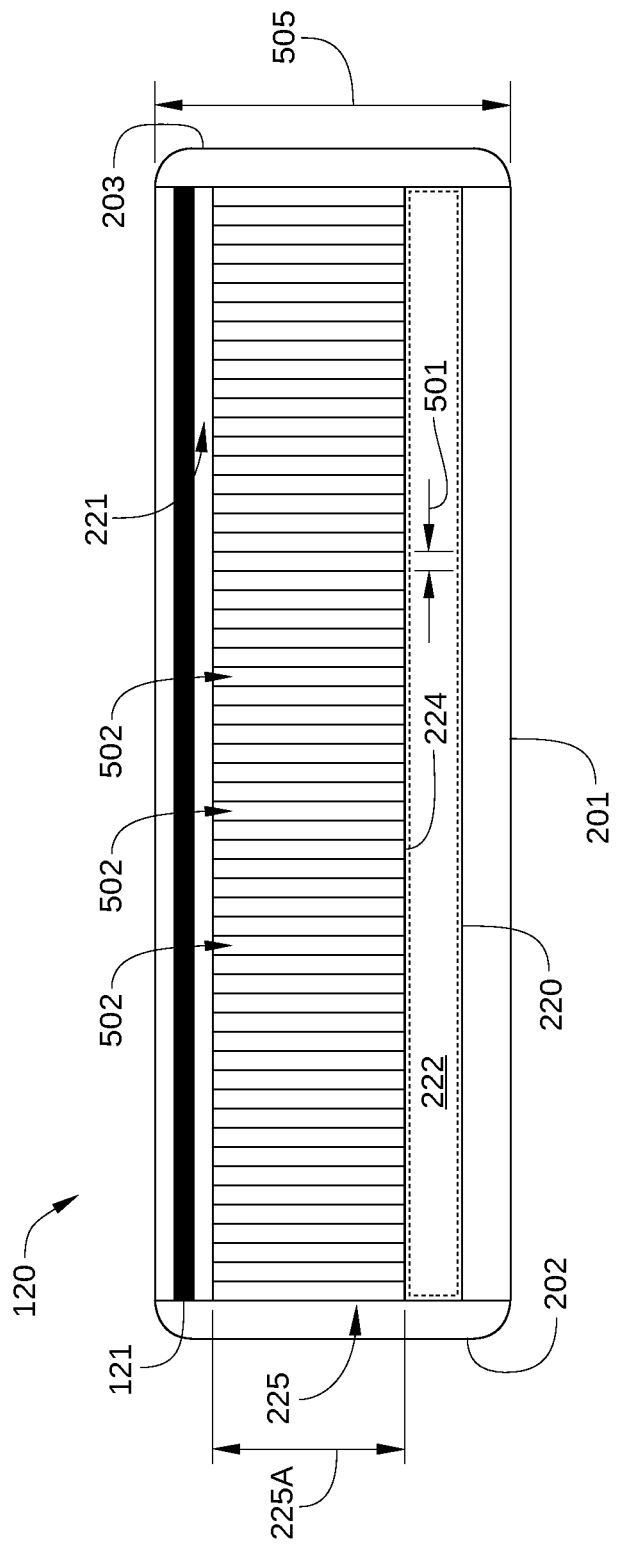
FIG. 5 is a schematic illustration of a heat sink and heat exchanger fins as viewed from a plenum of the display portion shown in FIGS. 2A-2C, according to various embodiments.

In some embodiments, the airflow impedance generated by heat exchanger fins 225 is further reduced because the airflow openings between heat exchanger fins 225 are significantly larger than the openings between heat exchanger fins associated with a conventional laptop computer heat sink. Such openings can have larger free area than the openings between heat exchanger fins of a conventional heat sink due to a wider spacing between heat exchanger fins, a greater opening height 225A (shown in FIG. 2B) of heat exchanger fins 225, or a combination of both. One such embodiment is illustrated in FIG. 5. FIG. 5 is a schematic illustration of heat sink 220 and heat exchanger fins 225 as viewed from plenum 232 of display portion 120, according to various embodiments. As shown, heat exchanger fins 225 are disposed on a wall 224 of heat sink 220, and are on an opposite side of wall 224 from vapor region 222 (indicated by dashed lines).

Because heat exchanger fins 225 extend across wall 224 from left edge 202 to right edge 203 of housing 201, each of heat exchanger fins 225 can be separated with a relatively wide spacing 501. Furthermore, because heat sink 220 is disposed in display portion 220 rather than under keyboard 101 of base portion 110, each of heat exchanger fins 225 can have a greater opening height 225A. For example, in some embodiments, airflow passages 502 between heat exchanger fins 225 each have an opening height 225A that extends from a surface of wall 224 to airflow gap 221 proximate display screen 121. In some embodiments, airflow passages 502 between heat exchanger fins 225 each have an opening height 225A that extends from a surface of wall 224 to a surface of display screen 121. In some embodiments, airflow passages 502 between heat exchanger fins 225 each have an opening height 225A that is greater than half of a thickness 505 of display portion 120. In other embodiments, airflow passages 502 between heat exchanger fins 225 can have varying dimensions and opening heights. As a result, each airflow passage 502 between heat exchanger fins 225 has a free area that is significantly greater than the free area of airflow passages associated with conventional laptop heat exchangers. Therefore, for a specific airflow, airflow impedance through airflow passages 502 is greatly reduced compared to airflow impedance through airflow passages associated with conventional laptop heat exchangers, resulting in quieter operation of laptop computer 100.

Low-Impedance Cooling Air Inlets and Outlets

Returning to FIGS. 2A-2C, cooling fans 230 are mounted on heat sink 220, and are configured to force cooling air across heat sink 225 and out of display portion 120. The cooling air enters display portion 120 via one or more cooling air inlets 233, is forced across heat exchanger fins 225 via plenum 232, and exits display portion 120 via cooling air outlet(s) 231. Cooling air inlets 233 and cooling air outlets 231 are disposed on or formed in a surface of housing 201 of display portion 120, rather than on a surface of base portion 110. Consequently, cooling air inlets 233 and cooling air outlets 231 are not limited in free area by the available surface area on side edges 105 (shown in FIG. 1) of base portion 110, where physical interfaces for various input and output devices (e.g., USB ports, external display ports, Ethernet ports, and the like) can greatly reduce available free area for cooling air inlets and/or outlets in base portion 110. As a result, cooling air inlets 233 and cooling air outlets 231 generate less airflow impedance and associated airflow noise for a specific airflow compared to the smaller free area of cooling air inlets and cooling air outlets disposed on surfaces of a base portion of a laptop computer. In addition, cooling air outlets 231 face upward and/or backward (i.e., away from display screen 121). Thus, cooling air outlets 231 direct exhausted air, fan noise, and airflow noise away from the user, thereby further reducing how audible such noise is to the user. Further, cooling air outlets 231 direct exhausted air, fan noise, and airflow noise away from whatever surface laptop computer 100 is resting on. Because such surfaces can reflect fan noise and airflow noise back toward the user, the configuration of cooling air outlets 231 as described herein prevents fan noise and airflow noise from being reflected toward the user. In addition, cooling air inlets 233 cannot be blocked by the lap of the user or other surface on which laptop computer 100 is rested. Instead, cooling air inlets are completely unobstructed whenever display portion 120 is unfolded for use.

In the embodiment illustrated in FIGS. 2A-2C, cooling air outlets 231 are disposed higher than cooling air inlets 233 when display portion is unfolded for use. That is, cooling air inlets 233 are positioned in a surface of housing 201 so that, when base portion 110 rests on a horizontal surface and display portion 120 is opened away from base portion 110, cooling air inlets 233 are positioned below cooling air outlets 231. As a result, cooling airflow across heat exchanger fins 225 is assisted by free convection. In addition, in some embodiments, when laptop computer 100 is operated at certain low operating powers, free convection of cooling air across heat exchanger fins 225 is sufficient to cool heat-generating electronic devices 241, and cooling fans 230 do not have to be operated.

Display-Side Cooling Fans

Because cooling fans 230 are disposed in display portion 120 instead of base portion 110, the size of cooling fans 230 can be increased relative to the overall size of laptop computer 100. That is, significant space is available in display portion 120 compared to base portion 110. Thus, cooling fans 230 can be over-sized relative to the quantity of cooling air being forced across heat exchanger fins 225. Therefore, in operation, cooling fans 230 can spin at a lower speed and generate less fan noise compared to smaller fans that are required to fit in base portion 110 (e.g., around or under keyboard 101, physical interface ports, and other interfering components disposed in base portion 110).

In some embodiments, cooling fans 230 are controlled to operate synchronously, i.e. at the same rotational speed. For example, in some embodiments, cooling fans 230 each operation at rotational speeds that are within about 100 rotations per minute of each other. In such embodiments, the beat phenomenon, which is caused by the constructive and destructive interference of fan noise of two different frequencies, is avoided. As a result, the acoustic experience of the user is improved. By contrast, in conventional laptop computers that include multiple cooling fans, for example one fan for cooling a CPU and one fan for cooling a GPU, as the fan speed of one cooling fan is adjusted, an audible beat tone can be generated by the difference in rotational frequency of the two fans, degrading the acoustic experience of the user. Furthermore, in embodiment in which the rotational frequency of both cooling fans 230 are controlled together, and therefore both run in unison, the heat-removal capacity of heat sink 220 can be employed to remove heat from PCB 240 even when only one of CPU 242 or GPU 243 is generating significant heat. Consequently, when only CPU 242 or GPU 243 is generating significant heat, lower fan speeds can be employed, and fan noise and airflow noise are reduced accordingly. By contrast, conventional laptop computers commonly include a dedicated cooling fan and associated heat sink for the CPU and a separately controlled cooling fan and associated heat sink for the GPU. Therefore, when only one of the CPU or GPU is generating significant heat, the cooling fan associated with that heat-generating component necessarily operates at or near maximum rotational frequency, creating fan noise and airflow noise audible to the user.

Variable-Sized Air Inlets

Figure 6:
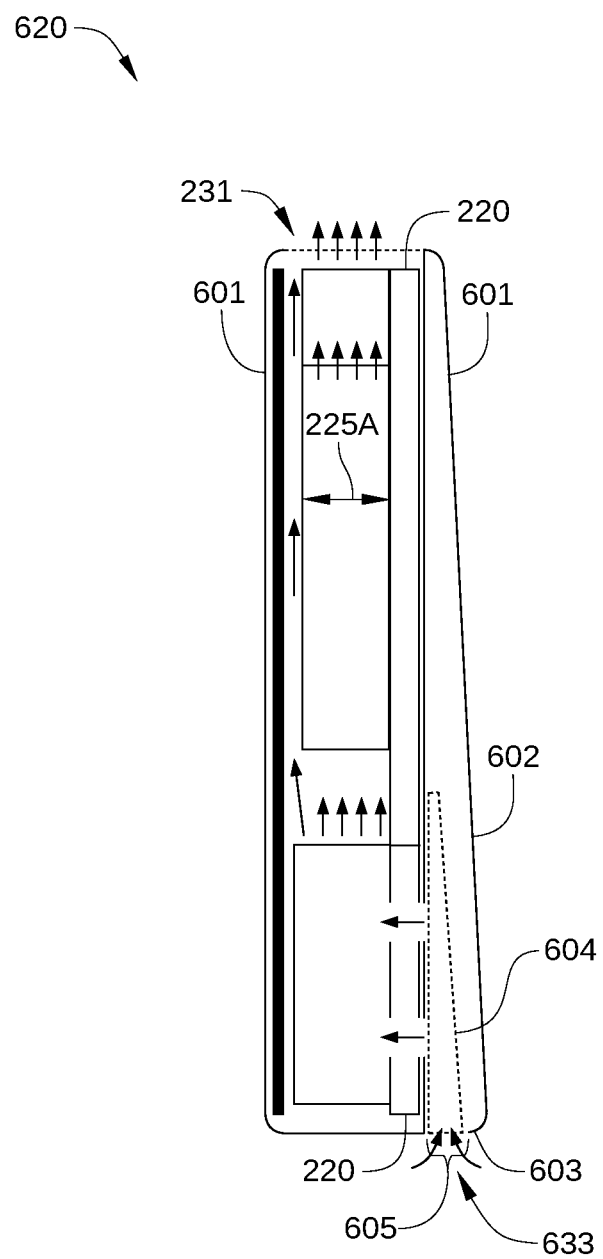
FIG. 6 is a schematic side view of a portion of a laptop computer with a variable sized cooling air inlet, according to various embodiments.

In the embodiment illustrated in FIGS. 2A-2C, cooling air inlets 233 are depicted as fixed openings in a surface of housing 201. In other embodiments, cooling air inlets can be configured as variable-sized openings. One such embodiment is illustrated in FIG. 6. FIG. 6 is a schematic side view of display portion 620 with a variable-sized cooling air inlet, according to various embodiments. As shown, display portion 620 is substantially similar to display portion 120 of FIGS. 2A-2C, except that display portion 620 includes a variable air inlet 633. In the embodiment illustrated in FIG. 6, variable air inlet 633 is formed when a rear cover 602 of a housing 601 of display portion 620 is opened. That is, a bottom edge 603 of rear cover 602 rotates outward from display portion 620 to form variable air inlet 633 between rear cover 602 and the remainder of display portion 620. Thus, a triangular opening 604 is formed proximate side edges of rear cover 602 as well as an edge opening 605 formed proximate bottom edge 603 of rear cover 602. In some embodiments, display portion 620 is configured with variable air inlet 633 in lieu of one or more cooling air inlets of fixed size formed in housing 601, such as cooling air inlets 233 in FIG. 2B. Alternatively, in some embodiments, display portion 620 is configured with variable air inlet 633 in addition to one or more cooling air inlets of fixed size formed in housing 601.

In some embodiments, variable air inlet 633 is opened via a mechanical linkage, for example when display portion 620 is unfolded for use. Alternatively or additionally, in some embodiments variable air inlet 633 is opened and closed in response to one or more measured temperatures, such as the temperature of CPU 242, GPU 243, PCB 240, heat sink 220, and/or cooling air exiting cooling air outlets 231. In such embodiments, the size of variable air inlet 633 may be varied by a motorized actuator. Alternatively or additionally, in some embodiments variable air inlet 633 is opened and closed in response to the measured power use of one or more heat-generating electronic devices 241, such as the power use of CPU 242, GPU 243, and the like. In such embodiments, the size of variable air inlet 633 is varied by a motorized actuator.

Figure 7:
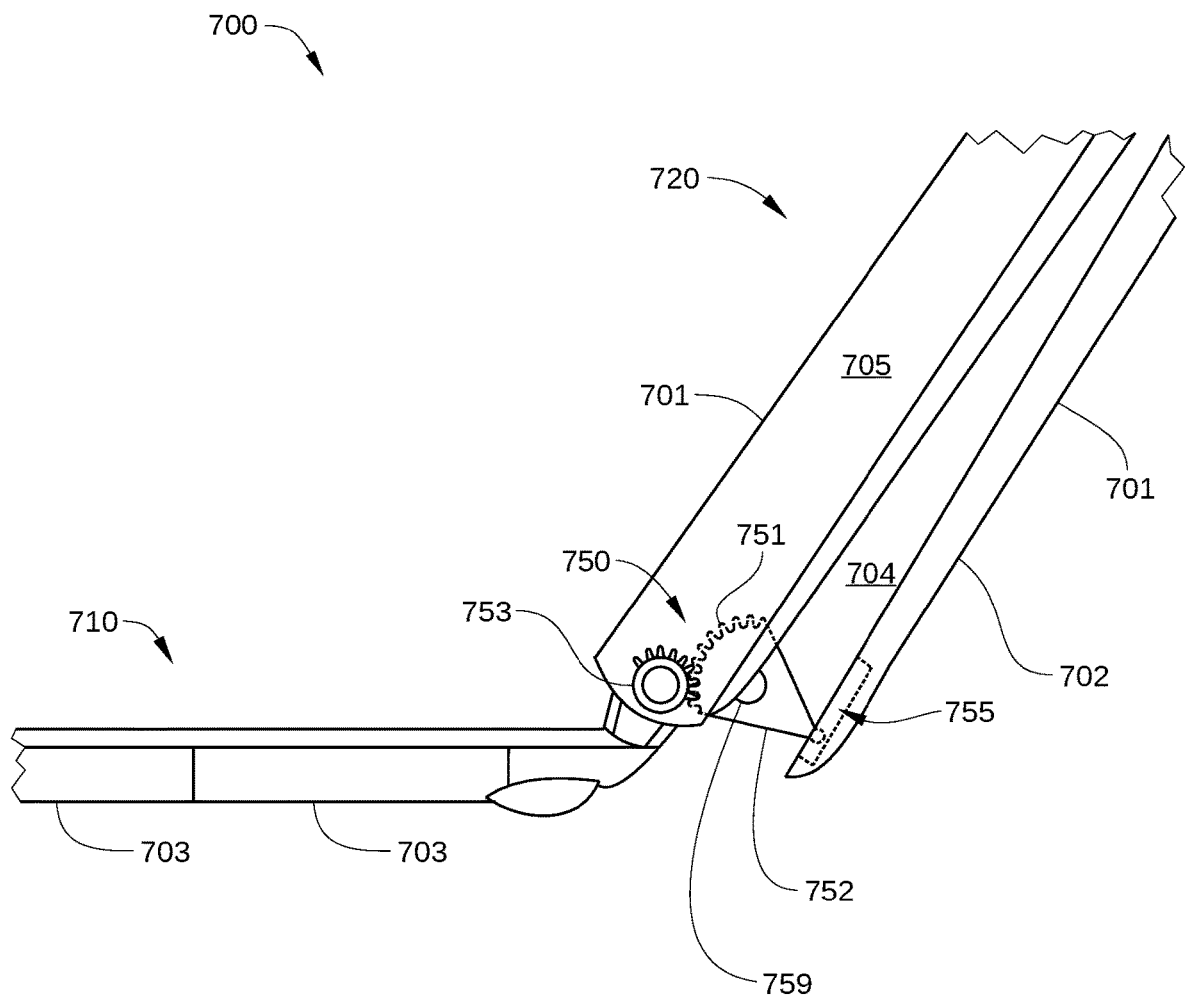
FIG. 7 is a partial side view of a laptop computer in which a display portion includes a housing with a movable panel, according to various embodiments.

FIG. 7 is a partial side view of a laptop computer 700 in which a display portion 720 includes a housing 701 with a movable panel 702, according to various embodiments. Laptop computer 700 includes a base portion 710 with one or more fixed panels 703 and display portion 720. As shown, a mechanical linkage 750 mechanically couples base portion 710 to movable panel 702, where actuation of mechanical linkage 750 causes an inlet opening 704 for a cooling fan (not shown) to be formed when display portion 720 is opened away from base portion 710. Inlet opening 704 is formed by mechanical linkage 750 positioning movable panel 702 away from one or more fixed panels 703 of base portion 710 when display portion 720 is opened away from base portion 710.

In the embodiment illustrated in FIG. 7, mechanical linkage 750 includes a rotating element 751 that rotates about a shaft 759 when display portion 720 opens away from base portion 710. Mechanical linkage 750 further includes a positioning arm 752 that mechanically couples movable panel 702 to rotating element 751. Positioning arm 752 is included in or mechanically coupled to rotating element 751. Therefore, when rotating element 751 rotates about shaft 759 (e.g., counter clockwise), positioning arm 752 rotates in the same direction about shaft 759 (e.g., counter clockwise). In the embodiment illustrated in FIG. 7, rotation of rotating element 751 in the clockwise direction is caused by display portion 720 being opened away from base portion 710. Conversely, in the embodiment illustrated in FIG. 7, rotation of rotating element 751 in the counterclockwise direction is caused by display portion 720 being closed toward base portion 710. In the embodiment shown, such rotation is enabled because shaft 759 is fixed to base portion 710 and rotating element 751 is configured as a driven gear that is coupled to a driving gear 753. Driving gear 753 is fixed relative to base portion 710, and therefore remains stationary relative to base portion 710 when display portion 720 is opened away from or closed toward base portion 710.

In the embodiment illustrated in FIG. 7, positioning arm 752 is mechanically coupled to movable panel 702 of display portion 720 via a positioning slot 755. Thus, in such an embodiment, positioning arm 752 is slidably coupled to display portion 720. As a result, clockwise rotation of positioning arm 752 causes movable panel 702 to move away from base portion 710 and causes inlet opening 704 to be formed. Conversely, counterclockwise rotation of positioning arm 752 causes movable panel 702 to move toward base portion 710, for example into a stowed position in which movable panel 702 is moved into contact with one or more fixed panels 705 of laptop computing device 700.

In the embodiment illustrated in FIG. 7, movable panel 702 includes a surface of computing device 700 that is a top surface of computing device 700 when display portion 720 is closed against base portion 710. In other embodiments, movable panel 702 includes one or more other surfaces of display portion 720, such as a side or edge surface of display portion 720. In the embodiment illustrated in FIG. 7, movable panel 702 is disposed in display portion 720 to form inlet opening 704 for one or more cooling fans (not shown) that are also disposed in display portion 720. In other embodiments, movable panel 702 is disposed in base portion 710 to form an inlet opening for one or more cooling fans (not shown) that are also disposed in base portion 710.

Heat Sink with Radially Divergent Cooling Fins

In the embodiment illustrated in FIGS. 2A-2C, heat sink fins are configured as an array of parallel fins. In some embodiments, a heat sink includes an array of radially diverging fins that are positioned to substantially align with or to be substantially parallel with an airflow direction associated with cooling air flowing into the heat sink from a cooling fan. As a result, the heat sink has reduced pressure drop associated with the cooling air flowing across the cooling fins. One such embodiment is described below in conjunction with FIG. 8.

Figure 8:
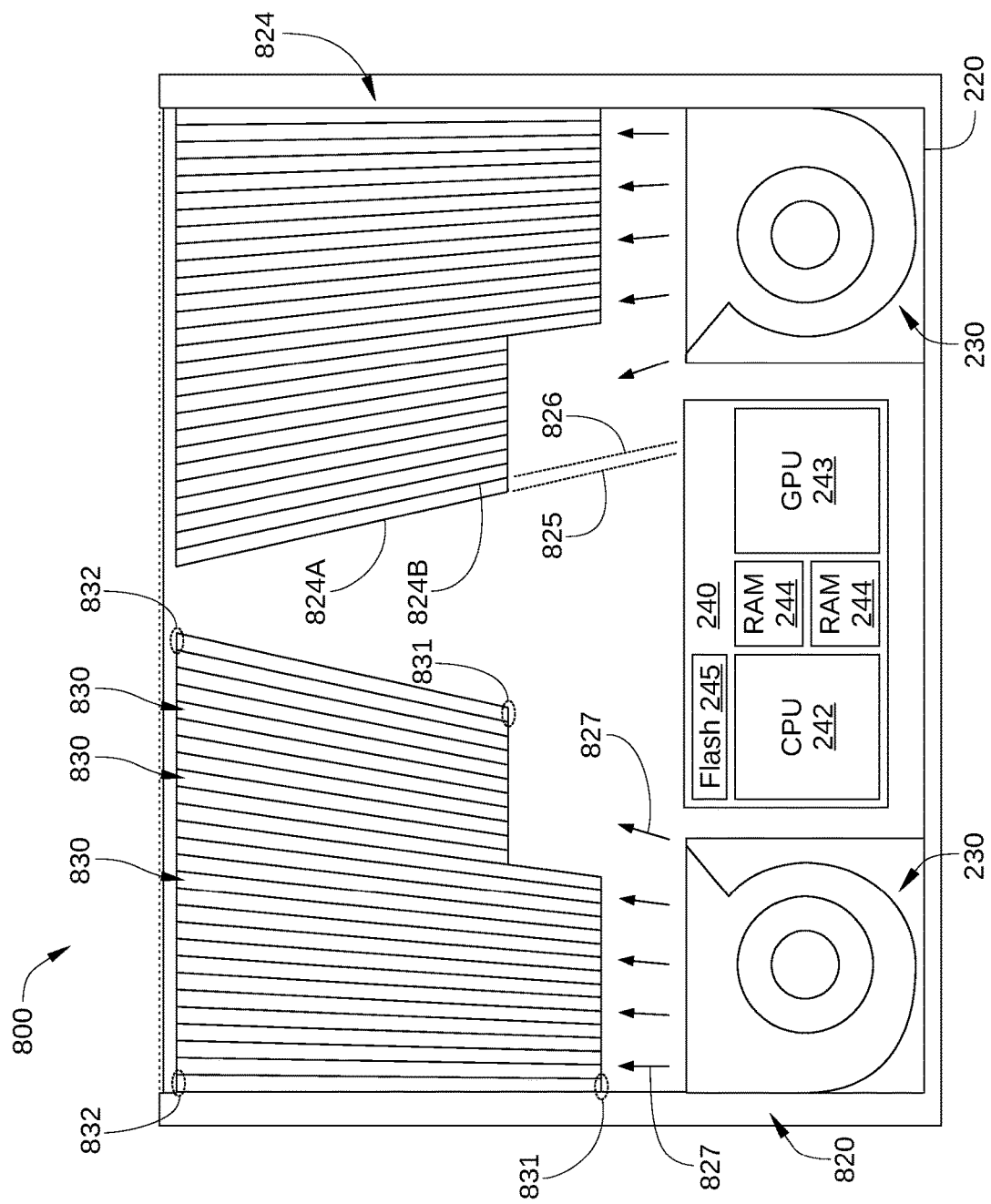
FIG. 8 is a schematic front view of a display portion of a laptop computer that includes a heat sink with an array of radially diverging fins, according to various embodiments.

FIG. 8 is a schematic front view of a display portion 800 of a laptop computer that includes a heat sink 820 with an array of radially diverging fins 824, according to various embodiments. As shown, an air passage 830 is formed between each pair of adjacent radially diverging fins 824. Further, each air passage 830 includes an inlet opening 831 and an outlet opening 832. Because radially diverging fins 824 diverge from each other in the direction of airflow, the inlet opening 831 for a particular air passage 830 has a smaller free area than the outlet opening 832 for that particular air passage.

In the embodiment illustrated in FIG. 8, each radially diverging fin 824 has a linear configuration, but in other embodiments, one or more of radially diverging fins 824 has a curved configuration. In the embodiment illustrated in FIG. 8, for a pair of adjacent radially diverging fins 824, a first line 825 defined by the first radially diverging fin 824 (e.g., fin 824A) intersects a second line 826 defined by the second fin (e.g., fin 824B. In such embodiments, the orientation of first line 825 may be selected to be parallel to an airflow direction 827 associated with cooling air flowing through the inlet opening 831 associated with the first radially diverging fin.

While the above embodiments are described in terms of a laptop computer, the embodiments can also be implemented in other types of computing devices, such as desktop computers, electronic tablets, smartphones, and the like.

In sum, a laptop computer is configured with heat-generating electronic devices, such as a CPU and/or a GPU, disposed in a display portion rather than in a base portion. In addition, heat transfer devices for dissipating thermal energy generated by the heat-generating electronic devices are also disposed in the display portion, such as cooling fans and a large surface-area, low airflow-impedance heat sink. Further, the heat sink may include cooling fins that are configured as an array of radially diverging fins. Further, a housing of the laptop computer may include one more movable panels that are positioned away from the housing to form a cooling air inlet opening when the laptop is opened.

At least one technical advantage of the disclosed design relative to the prior art is that, in the disclosed design, the heat-generating integrated circuits are disposed within the display portion of the computing device, which allows a larger vapor chamber to be implemented. The larger vapor chamber enables greater heat removal capacity and greater cooling efficiency, which allows the computing device to perform at higher operating levels. Further, in the disclosed design, the cooling fans also are disposed within the display portion of the computing device, which allows larger cooling fans to be implemented. Because larger cooling fans can provide sufficient levels of cooling airflow at lower speeds, cooling fan noise is reduced in the disclosed design without negatively impacting the peak computational performance of the computing device. In addition, in the disclosed design, air outlet openings also are disposed within the display portion of the computing device, which results in cooling airflow being directed away from the user and a further reduction in overall cooling fan noise.

Another technical advantage of the disclosed design relative to the prior art is that, in the disclosed design, the cooling fins of the heat exchanger are more aligned with the direction of incoming airflow relative to the cooling fins of a conventional heat exchanger. As a result, there is relatively less pressure drop across the heat exchanger in the disclosed design. Among other things, the reduced pressure drop enables sufficient levels of cooling airflow to be provided at lower cooling fan speeds, thereby reducing cooling fan noise without negatively impacting the peak computational performance of the computing device.

Yet another technical advantage of the disclosed design relative to the prior art is that, in the disclosed design, the inlet openings for the cooling fans are formed in surfaces of the computing device other than the bottom surface of the computing device. Thus, with the disclosed design, the cooling efficiency of the computing device is not affected by the surface on which the computing device rests. In addition, in the disclosed design, the inlet openings for the cooling fans that are formed via the movable panel have a greater free area, and a correspondingly lower pressure drop, relative to the air inlet openings disposed on the bottom surface of a conventional laptop computer. Among other things, the lower pressure drop enables sufficient levels of cooling airflow to be provided at lower cooling fan speeds, thereby reducing cooling fan noise without negatively impacting the peak computational performance of the computing device.

These technical advantages represent one or more technological improvements over prior art computing device designs.

1. In some embodiments, a computing device, comprises: a heat sink that has a plurality of cooling fins and a vapor chamber; one or more heat-generating electronic devices that are thermally coupled to the vapor chamber; and at least one cooling fan configured to direct cooling air across the plurality of cooling fins, wherein a first fin included in the plurality of cooling fins and a second fin included in the plurality of cooling fins form a first air passage that has a first air inlet opening and a first air outlet opening, and wherein the first fin is adjacent to the second fin, and a first distance between the first fin and the second fin proximate to the first air inlet opening is less than a second distance between the first fin and the second fin proximate to the first air outlet opening.

2. The computing device of clause 1, wherein the plurality of cooling fins includes an array of radially diverging fins.

3. The computing device of clauses 1 or 2, wherein the first air inlet opening has a smaller free area than the first air outlet opening.

4. The computing device of any of clauses 1-3, wherein the at least one cooling fan is mounted on the vapor chamber.

5. The computing device of any of clauses 1-4, wherein: each of the first fin and the second fin has a linear configuration; and a first line defined by the first fin intersects a second line defined by the second fin.

6. The computing device of any of clauses 1-5, wherein the first line is parallel to an airflow direction associated with cooling air flowing through the first air inlet opening.

7. The computing device of any of clauses 1-6, wherein: a third fin included in the plurality of cooling fins and the second fin form a second air passage that has a second air inlet opening and a second air outlet opening, the third fin is adjacent to the second fin, and a third distance between the third fin and the second fin proximate to the second air inlet opening is less than a fourth distance between the third fin and the second fin proximate to the second air outlet opening.

8. The computing device of any of clauses 1-7, wherein: each of the second fin and the third fin has a linear configuration; and a first line defined by the first fin intersects a second line defined by the second fin.

9. The computing device of any of clauses 1-8, wherein the first line is parallel to an airflow direction associated with cooling air flowing through the first air inlet opening and the second line is parallel to an airflow direction associated with cooling air flowing through the second air inlet opening.

10. The computing device of any of clauses 1-9, wherein the one or more heat-generating electronic devices are mounted on a printed circuit board that is coupled to the vapor chamber.

11. The computing device of any of clauses 1-10, wherein the heat sink, the one or more heat-generating electronic devices, and the at least one cooling fan are disposed within a display portion of the computing device.

12. The computing device of any of clauses 1-11, wherein the display portion is configured to be movably coupled to a base portion of a computing device that includes a keyboard.

13. In some embodiments, a display comprises: a heat sink with a plurality of cooling fins and a vapor chamber; and at least one cooling fan configured to direct cooling air across the cooling fins, wherein a first fin in the plurality of cooling fins and a second fin in the plurality of cooling fins that is adjacent to the first fin form a first air passage that has a first air inlet opening and a first air outlet opening, and wherein a first separation between the first fin and the second fin at the first air inlet opening is smaller than a second separation between the first fin and the second fin at the first air outlet opening.

14. The display of clause 13, wherein the display is configured to be movably coupled to a base of a computing device that includes a keyboard.

15. The display of clauses 13 or 14, wherein the plurality of cooling fins includes an array of radially diverging fins.

16. The display of any of clauses 13-15, wherein the first air inlet opening has a smaller free area than the first air outlet opening.

17. The display of any of clauses 13-16, wherein the at least one cooling fan is mounted on the vapor chamber.

18. The display of any of clauses 13-17, wherein: each of the first fin and the second fin has a linear configuration; and a first line defined by the first fin intersects a second line defined by the second fin.

19. The display of any of clauses 13-18, wherein the first line is parallel to an airflow direction associated with cooling air flowing through the first air inlet opening.

20. The display of any of clauses 13-19, wherein: a third fin included in the plurality of cooling fins and the second fin form a second air passage that has a second air inlet opening and a second air outlet opening, the third fin is adjacent to the second fin, and a third distance between the third fin and the second fin proximate to the second air inlet opening is less than a fourth distance between the third fin and the second fin proximate to the second air outlet opening.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

While the preceding is directed to embodiments of the present disclosure, other and further embodiments of the disclosure may be devised without departing from the basic scope thereof, and the scope thereof is determined by the claims that follow.

What is claimed is:

1. A computing device, comprising:
   a heat sink that has a plurality of cooling fins and a vapor chamber;
   one or more heat-generating electronic devices that are thermally coupled to the vapor chamber;
   an air outlet that spans the plurality of cooling fins and through which cooling air exits a display portion of the computing device; and
   a first cooling fan and a second cooling fan that are configured to direct cooling air across the plurality of cooling fins,
   wherein each pair of adjacent cooling fins included in the plurality of cooling fins forms an air passage that is substantially aligned with an airflow direction between either the first cooling fan or the second cooling fan and the air outlet,
   wherein a first fin included in the plurality of cooling fins and a second fin included in the plurality of cooling fins form a first air passage that has a first air inlet opening and a first air outlet opening, and
   wherein each of the first fin and the second fin has a planar shape, the first fin is adjacent to the second fin with no intervening fins between the first fin and the second fin, and a first distance between the first fin and the second fin proximate to the first air inlet opening is less than a second distance between the first fin and the second fin proximate to the first air outlet opening.

2. The computing device of claim 1, wherein the plurality of cooling fins includes an array of radially diverging fins.

3. The computing device of claim 1, wherein the first air inlet opening has a smaller free area than the first air outlet opening.

4. The computing device of claim 1, wherein at least one of the first cooling fan or the second cooling fan is mounted on the vapor chamber.

5. The computing device of claim 1, wherein:
   each of the first fin and the second fin has a planar shape that is flat; and
   a first line defined by the first fin intersects a second line defined by the second fin.

6. The computing device of claim 5, wherein the first line is substantially aligned with an airflow direction associated with cooling air flowing through the first air inlet opening.

7. The computing device of claim 1, wherein:
   a third fin included in the plurality of cooling fins and the second fin form a second air passage that has a second air inlet opening and a second air outlet opening,
   the third fin is adjacent to the second fin with no intervening fins between the second fin and the third fin, and a third distance between the third fin and the second fin proximate to the second air inlet opening is less than a fourth distance between the third fin and the second fin proximate to the second air outlet opening.

8. The computing device of claim 7, wherein:
   each of the second fin and the third fin has a planar shape that is flat; and
   a first line defined by the first fin intersects a second line defined by the third fin.

9. The computing device of claim 8, wherein the first line is substantially aligned with an airflow direction associated with cooling air flowing through the first air inlet opening and the second line is substantially aligned with an airflow direction associated with cooling air flowing through the second air inlet opening.

10. The computing device of claim 1, wherein the one or more heat-generating electronic devices are mounted on a printed circuit board that is coupled to the vapor chamber.

11. The computing device of claim 1, wherein the heat sink, the one or more heat-generating electronic devices, and at least one of the first cooling fan or the second cooling fan is disposed within the display portion of the computing device.

12. The computing device of claim 11, wherein the display portion is configured to be movably coupled to a base portion of a computing device that includes a keyboard.

13. A display, comprising:
   a heat sink with a plurality of cooling fins and a vapor chamber;
   an air outlet that spans the plurality of cooling fins and through which cooling air exits the display; and
   a first cooling fan and a second cooling fan that are configured to direct cooling air across the cooling fins,
   wherein each pair of adjacent cooling fins included in the plurality of cooling fins forms an air passage that is substantially aligned with an airflow direction between either the first cooling fan or the second cooling fan and the air outlet,
   wherein a first fin in the plurality of cooling fins and a second fin in the plurality of cooling fins form a first air passage that has a first air inlet opening and a first air outlet opening, and
   wherein each of the first fin and the second fin has a planar shape, the first fin is adjacent to the second fin with no intervening fins between the first fin and the second fin, and a first separation between the first fin and the second fin at the first air inlet opening is smaller than a second separation between the first fin and the second fin at the first air outlet opening.

14. The display of claim 13, wherein the display is configured to be movably coupled to a base of a computing device that includes a keyboard.

15. The display of claim 13, wherein the plurality of cooling fins includes an array of radially diverging fins.

16. The display of claim 13, wherein the first air inlet opening has a smaller free area than the first air outlet opening.

17. The display of claim 13, wherein at least one of the first cooling fan or the second cooling fan is mounted on the vapor chamber.

18. The display of claim 13, wherein:
   each of the first fin and the second fin has a planar shape that is flat; and
   a first line defined by the first fin intersects a second line defined by the second fin.

19. The display of claim 18, wherein the first line is parallel to an airflow direction associated with cooling air flowing through the first air inlet opening.

20. The display of claim 13, wherein:
- a third fin included in the plurality of cooling fins and the second fin form a second air passage that has a second air inlet opening and a second air outlet opening,
- the third fin is adjacent to the second fin with no intervening fins between the second fin and the third fin, and
- a third separation between the third fin and the second fin proximate to the second air inlet opening is less than a fourth separation between the third fin and the second fin proximate to the second air outlet opening.

* * * * *